(12) United States Patent
Kim et al.

(10) Patent No.: US 9,583,340 B2
(45) Date of Patent: Feb. 28, 2017

(54) SEMIPOLAR NITRIDE SEMICONDUCTOR STRUCTURE AND METHOD OF MANUFACTURING THE SAME

(71) Applicant: SAMSUNG ELECTRONICS CO., LTD., Suwon-Si, Gyeonggi-do (KR)

(72) Inventors: Jun-Youn Kim, Hwaseong-si (KR); Jae-Kyun Kim, Hwaseong-si (KR); Joo-Sung Kim, Seongnam-si (KR); Young-Soo Park, Yongin-si (KR); Young-Jo Tak, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 25 days.

(21) Appl. No.: 14/532,921

(22) Filed: Nov. 4, 2014

(65) Prior Publication Data

US 2015/0123140 A1    May 7, 2015

(30) Foreign Application Priority Data

Nov. 5, 2013  (KR) .................. 10-2013-0133820

(51) Int. Cl.
| | |
|---|---|
| *C30B 29/40* | (2006.01) |
| *H01L 21/02* | (2006.01) |
| *C30B 25/18* | (2006.01) |
| *H01L 33/12* | (2010.01) |
| *H01L 33/00* | (2010.01) |

(52) U.S. Cl.
CPC ....... *H01L 21/02458* (2013.01); *C30B 25/183* (2013.01); *C30B 29/403* (2013.01); *H01L 21/0243* (2013.01); *H01L 21/0254* (2013.01); *H01L 21/02381* (2013.01); *H01L 21/02433* (2013.01); *H01L 21/02507* (2013.01);
(Continued)

(58) Field of Classification Search
CPC .................................................... H01L 33/0066
See application file for complete search history.

(56) References Cited

U.S. PATENT DOCUMENTS

| | | | |
|---|---|---|---|
| 6,372,608 B1 | 4/2002 | Shimoda et al. | |
| 6,645,830 B2 | 11/2003 | Shimoda et al. | |
(Continued)

FOREIGN PATENT DOCUMENTS

| | | | |
|---|---|---|---|
| JP | 2009-519202 A | 5/2009 | |
| JP | 2012-031028 A | 2/2012 | |
(Continued)

OTHER PUBLICATIONS

Reiher et al., Metalorganic vapor-phase epitaxy of GaN layers on Si substrate with Si(110) and other high-index surfaces, Journal of Crystal Growth, 312, 2010, 180-184.*
(Continued)

*Primary Examiner* — Francisco Tschen
(74) *Attorney, Agent, or Firm* — Muir Patent Law, PLLC

(57) ABSTRACT

Provided are a semipolar nitride semiconductor structure and a method of manufacturing the same. The semipolar nitride semiconductor structure includes a silicon substrate having an Si(11k) surface satisfying 7≤k≤13; and a nitride semiconductor layer formed on the silicon substrate. The nitride semiconductor layer has a semipolar characteristic in which a polarization field is approximately 0.

12 Claims, 5 Drawing Sheets

(52) U.S. Cl.
CPC .. *H01L 21/02609* (2013.01); *H01L 21/02658* (2013.01); *H01L 33/007* (2013.01); *H01L 33/12* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,691,658 B2 | 4/2010 | Kaeding et al. | |
| 7,709,857 B2 | 5/2010 | Kim et al. | |
| 7,759,140 B2 | 7/2010 | Lee et al. | |
| 7,777,217 B2 | 8/2010 | Preble et al. | |
| 7,781,727 B2 | 8/2010 | Sherrer et al. | |
| 7,790,482 B2 | 9/2010 | Han et al. | |
| 7,897,490 B2 | 3/2011 | Preble et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,976,630 B2 | 7/2011 | Poblenz et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,044,434 B2 | 10/2011 | Ohta et al. | |
| 8,049,161 B2 | 11/2011 | Sherrer et al. | |
| 8,110,482 B2 | 2/2012 | Kaeding et al. | |
| 8,126,024 B1 | 2/2012 | Raring | |
| 8,129,711 B2 | 3/2012 | Kang et al. | |
| 8,179,938 B2 | 5/2012 | Kim | |
| 8,183,557 B2 | 5/2012 | Iza et al. | |
| 8,193,079 B2 | 6/2012 | Kaeding et al. | |
| 8,202,793 B2 | 6/2012 | Preble et al. | |
| 8,263,987 B2 | 9/2012 | Choi et al. | |
| 8,324,646 B2 | 12/2012 | Lee et al. | |
| 8,349,711 B2 | 1/2013 | Preble et al. | |
| 8,368,179 B2 | 2/2013 | Kaeding et al. | |
| 8,399,944 B2 | 3/2013 | Kwak et al. | |
| 8,432,511 B2 | 4/2013 | Jeong | |
| 8,435,879 B2 | 5/2013 | Hanser et al. | |
| 8,459,832 B2 | 6/2013 | Kim | |
| 8,502,242 B2 | 8/2013 | Kim | |
| 8,536,604 B2 | 9/2013 | Kwak et al. | |
| 8,637,848 B2 | 1/2014 | Preble et al. | |
| 8,735,931 B2 | 5/2014 | Han et al. | |
| 8,766,295 B2 | 7/2014 | Kim | |
| 2002/0069816 A1* | 6/2002 | Gehrke | C30B 25/02 117/84 |
| 2002/0074561 A1* | 6/2002 | Sawaki | H01L 33/16 257/103 |
| 2004/0107891 A1* | 6/2004 | Nagai | C30B 25/02 117/2 |
| 2007/0205407 A1* | 9/2007 | Matsuo | H01L 29/045 257/13 |
| 2009/0267078 A1 | 10/2009 | Mishra et al. | |
| 2010/0011658 A1 | 1/2010 | Bruso | |
| 2010/0065854 A1 | 3/2010 | Kamber et al. | |
| 2010/0189981 A1 | 7/2010 | Poblenz et al. | |
| 2011/0262773 A1 | 10/2011 | Poblenz et al. | |
| 2012/0086017 A1 | 4/2012 | Hwang et al. | |
| 2012/0104411 A1 | 5/2012 | Iza et al. | |
| 2013/0064261 A1 | 3/2013 | Sharma et al. | |

FOREIGN PATENT DOCUMENTS

| | | |
|---|---|---|
| KR | 10-2008-0096783 A | 11/2008 |
| KR | 10-2010-0017413 A | 2/2010 |
| KR | 10-2010-0134480 A | 12/2010 |
| KR | 10-2012-0096654 A | 8/2012 |

OTHER PUBLICATIONS

R. Ravash et al., "Semipolar single component GaN on planar high index Si(11h) substrates," Applied Physics Letters, vol. 97 (2010) pp. 142102-1 to 142102-3.

X. Ni et al., "Nonpolar m-plane GaN on patterned Si(112) substrates by metalorganic chemical vapor deposition," Applied Physics Letters, vol. 95 (2009) pp. 111102-1 to 111102-3.

N. Sawaki et al., "Growth and properties of semi-polar GaN on a pattrned silicon substrate," Journal of Crystal Growth, vol. 311 (2009), pp. 2867-2874.

* cited by examiner

SEMIPOLAR NITRIDE SEMICONDUCTOR STRUCTURE AND METHOD OF MANUFACTURING THE SAME

CROSS-REFERENCE TO RELATED APPLICATIONS

This application claims the benefit of Korean Patent Application No. 10-2013-0133820, filed on Nov. 5, 2013, in the Korean Intellectual Property Office, the disclosure of which is incorporated herein in its entirety by reference.

BACKGROUND

The inventive concept relates to a nitride semiconductor, and more particularly, to a semipolar nitride semiconductor structure having a semipolar characteristic, and a method of manufacturing the semipolar nitride semiconductor structure.

It is absolutely necessary to lower a price of a light emitting diode (LED) for market entry of solid state lighting. For this, it is necessary to increase productivity by increasing the size of a substrate and to reduce cost by increasing chip efficiency.

Methods to reduce costs include reducing the price of a luminaire by suppressing efficiency droop to reduce the number of chips used for a bulb, and replacing a present phosphor conversion LED with color mixing to increase efficiency. As a method of replacing a present fluorescent light by reducing the price of solid state lighting, an LED is used that increases productivity and has high efficiency and low efficiency droop, having a large substrate of 8 inches or more.

There have been many arguments on reasons for efficiency droop. Known reasons are light leakage due to many dislocations within a quantum well and an overflow of electrons due to energy band bending through a piezoelectric field. As a method of suppressing efficiency droop caused by the above-described reasons, there a nonpolar GaN substrate has been implemented. When a nonpolar substrate is used, no polarization field is generated, and thus energy band bending is prevented. Thus, overflow may be reduced, and defects occurring due to the use of a GaN bulk substrate may be reduced by more than 100 times as compared with a hetero-epitaxy method of the related art.

However, a GaN bulk substrate has a diameter of 4 to 6 inches, and the price thereof is several thousands of dollars, and thus it is difficult to apply the GaN bulk substrate for commercial purposes. Furthermore, in practice, the price of a non-polar or semipolar GaN substrate is high.

SUMMARY

The inventive concept provides a semipolar nitride semiconductor structure that may be manufactured using a silicon substrate, and a method of manufacturing the semipolar nitride semiconductor structure.

According to an aspect of the inventive concept, there is provided a semipolar nitride semiconductor structure including a silicon substrate having an Si(11k) surface satisfying $7 \leq k \leq 13$; and a nitride semiconductor layer on the silicon substrate, wherein the nitride semiconductor layer has a semipolar characteristic in which a polarization field is approximately 0.

The Si(11k) surface of the silicon substrate may include an Si(111) facet being exposed by a larger amount than that of an Si(100) facet.

The nitride semiconductor layer may be a GaN thin film. An angle $\theta$ between a c-axis of the GaN thin film and the Si(11k) surface of the silicon substrate may be within a range satisfying $35° \leq \theta \leq 45°$.

The semipolar nitride semiconductor structure may further include a buffer layer interposed between the silicon substrate and the nitride semiconductor layer. The buffer layer may be formed of a material including any one selected from a group consisting of AlN, AlGaN, a step grade $Al_xIn_yGa_{1-x-y}N$ ($0 \leq x$, $y \leq 1$, $x+y \leq 1$), and an $Al_{x1}In_{y1}Ga_{1-x1-y1}N/Al_{x2}In_{y2}Ga_{1-x2-y2}N$ ($0 \leq x1$, $x2$, $y1$, $y2 \leq 1$, $x1 \neq x2$ or $y1 \neq y2$, $x1+y1 \leq 1$, $x2+y2 \leq 1$) superlattice.

The semipolar nitride semiconductor structure may further include a nucleation-growth layer interposed between the silicon substrate and the buffer layer. The nucleation-growth layer may be formed of AlN.

According to another aspect of the inventive concept, there is provided a method of manufacturing a semipolar nitride structure, the method including: preparing a silicon substrate having an Si(11k) surface satisfying $7 \leq k \leq 13$; and growing a nitride semiconductor layer on the silicon substrate. The nitride semiconductor layer has a semipolar characteristic in which a polarization field is approximately 0.

The method may further include performing anisotropic etching on the Si(11k) surface of the silicon substrate so that an Si(111) facet is exposed by a larger amount than that of an Si(100) facet. The anisotropic etching may be performed using any one etching solution selected from a group consisting of KOH, TMAH, EDP, N2H2, HaOH, and CsOH. The anisotropic etching may be maskless etching.

The nitride semiconductor layer may be a single crystalline GaN thin film. A c-axis of the GaN thin film may be within a range satisfying $35° \leq \theta \leq 45°$.

The growing of the nitride semiconductor layer may include forming a buffer layer on the silicon substrate. The buffer layer may be formed of a material including any one selected from a group consisting of AlN, AlGaN, a step grade $Al_xIn_yGa_{1-x-y}N$ ($0 \leq x$, $y \leq 1$, $x+y \leq 1$), and an $Al_{x1}In_{y1}Ga_{1-x1-y1}N/Al_{x2}In_{y2}Ga_{1-x2-y2}N$ ($0 \leq x1$, $x2$, $y1$, $y2 \leq 1$, $x1 \neq x2$ or $y1 \neq y2$, $x1+y1 \leq 1$, $x2+y2 \leq 1$) superlattice.

The growing of the nitride semiconductor layer may include forming a nucleation-growth layer on the silicon substrate.

The nucleation-growth layer may be formed of AlN.

The method may further include forming a nitride bulk layer using the nitride semiconductor layer as a seed layer.

The method may further include removing the silicon substrate. When the silicon substrate is removed, at least portions of the nucleation-growth layer and the buffer layer may be removed.

The semipolar nitride semiconductor structure according to the above-described embodiments may have a good semipolar characteristic in which a polarization field substantially has a value of approximately 0.

In the method of manufacturing the semipolar nitride semiconductor structure according to the above-described embodiments, anisotropic etching is performed on a silicon substrate with an Si(11k) surface having a high index by using an anisotropic etching solution so as to sufficiently expose a Si(111) facet. Thus, it is possible to form a single crystalline nitride semiconductor structure having a good semipolar characteristic on a silicon substrate across a large area.

The semipolar nitride semiconductor structure according to the above-described embodiments may be manufactured as a nitride bulk substrate by using a nitride semiconductor layer formed on a silicon substrate as a seed layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
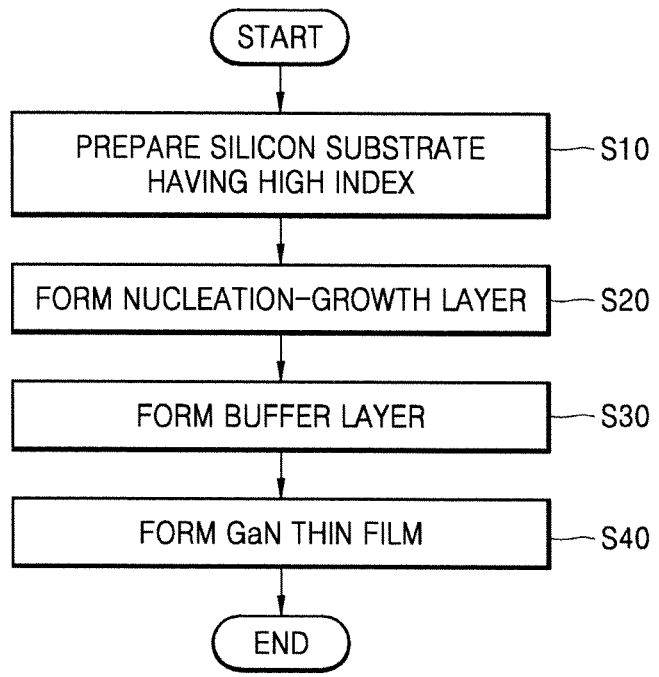
FIG. 1 is a flowchart illustrating a method of manufacturing a semipolar nitride semiconductor structure according to an embodiment of the inventive concept.

Hereinafter, the present invention will be described in detail by explaining exemplary embodiments of the invention with reference to the attached drawings. The same reference numerals in the drawings denote the same element. In the drawings, the thicknesses of layers and regions are exaggerated for clarity. Expressions such as "at least one of," when preceding a list of elements, modify the entire list of elements and do not modify the individual elements of the list.

FIG. 1 is a flowchart illustrating a method of manufacturing a semipolar nitride semiconductor structure according to an embodiment of the inventive concept. FIGS. 2A to 2D are diagrams sequentially illustrating a semipolar nitride semiconductor structure manufactured according to an embodiment of the inventive concept.

FIG. 2A and FIG. 3A to FIG. 6C show a process of preparing a silicon substrate 100 used to grow a nitride semiconductor.

Figure 2A:
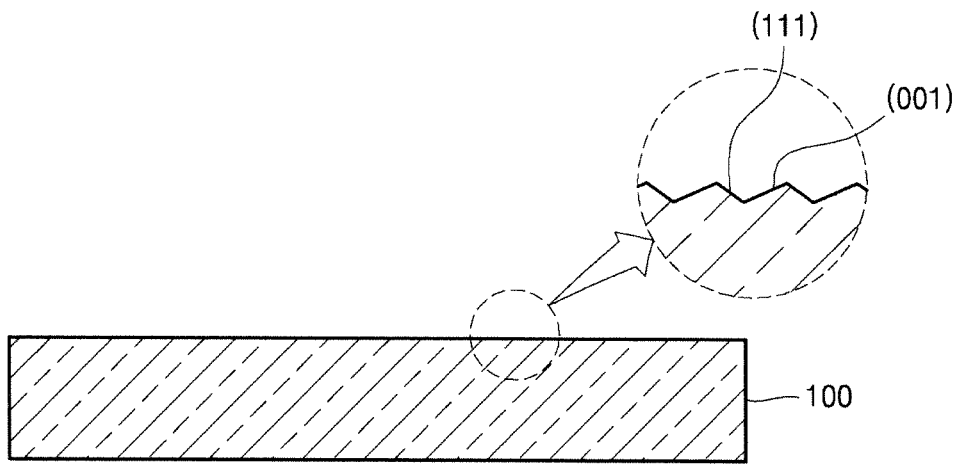
FIGS. 2A to 2D are diagrams sequentially illustrating a semipolar nitride semiconductor structure that is manufactured according to an embodiment of the inventive concept.

Referring to FIG. 2A, the silicon substrate 100 having a high index crystal orientation for manufacturing a semipolar nitride semiconductor structure is prepared (operation S10). The term "silicon substrate 100 having a high index crystal orientation" used herein means an Si substrate having an Si(11k) surface with a high k value satisfying 7≤k≤13. For example, a large-scaled substrate having a diameter of 10 mm to 18 inches may be used as the silicon substrate 100, but the inventive concept is not limited thereto.

Next, anisotropic etching is performed on the Si(11k) surface of the silicon substrate 100 (operation S20). The Si(11k) surface of the silicon substrate 100 may allow an Si(111) facet to be exposed by a larger amount than an Si(100) facet through the anisotropic etching. The anisotropic etching may be wet etching. The anisotropic etching may be maskless etching.

Figure 3A:
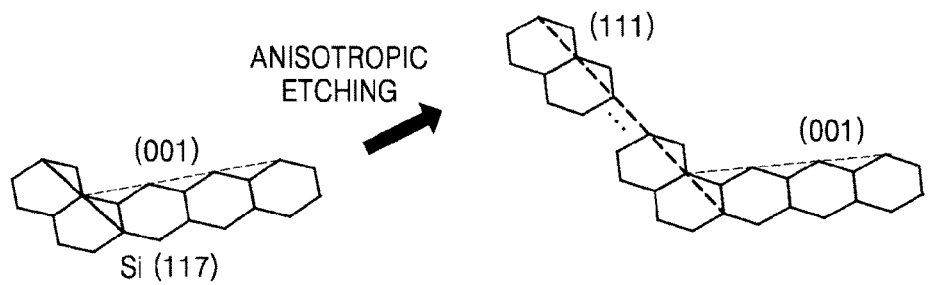
FIGS. 3A to 3C are schematic diagrams illustrating a silicon substrate for manufacturing a semipolar nitride semiconductor structure on which anisotropic etching is performed, according to an embodiment of the inventive concept.
Figure 3B:
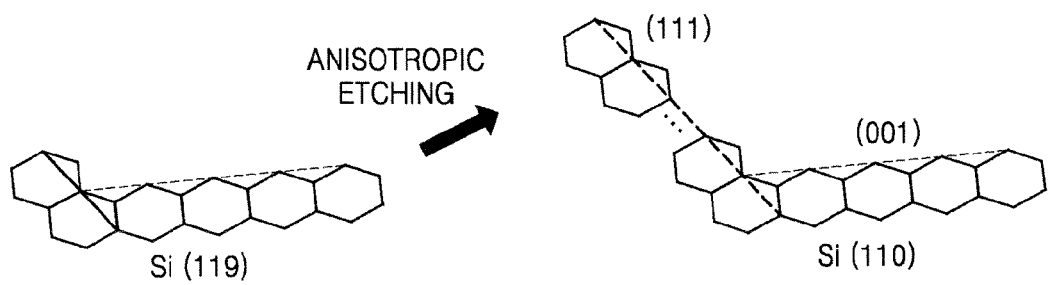
Figure 3C:
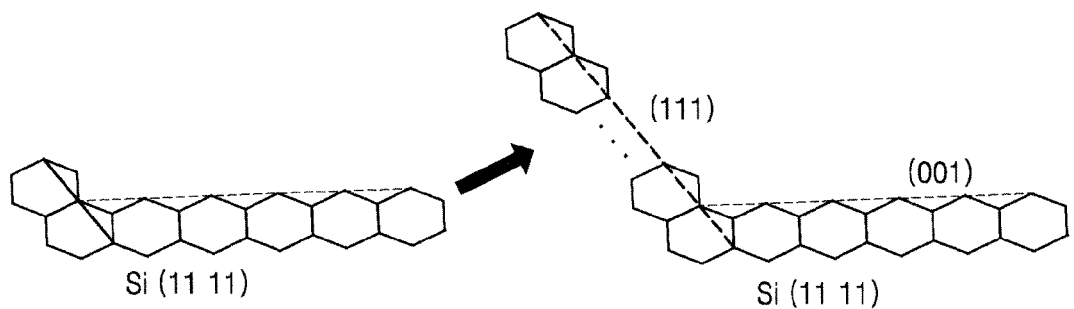

FIG. 3A illustrates that anisotropic etching is performed on a silicon substrate having an Si(117) surface to expose the Si(111) facet. FIG. 3B illustrates that anisotropic etching is performed on a silicon substrate having an Si(119) surface to expose the Si(111) facet. FIG. 3C illustrates that anisotropic etching is performed on a silicon substrate having an Si(11 11) surface to expose the Si(111) facet. It is known that etching speed of the Si(111) facet is considerably lower than etching speed of the Si(001) facet in terms of crystallography of silicon. Table 1 below shows anisotropic etching of anisotropic etching solutions for silicon. Besides the anisotropic etching solutions shown in Table 1, a well-known silicon anisotropic etching solution such as $N_2H_2$, HaOH, or CsOH may be used.

TABLE

| Etching Solution | Ratio of Etching Rates | | Etching Rate (Absolute Value) | | |
|---|---|---|---|---|---|
| | 100/(111) | (110)/(111) | 100 | $Si_3N_4$ | $SiO_2$ |
| KOH (44%, 85° C.) | 300 | 600 | 1.4 µm/min | <1 Å/min | <14 Å/min |
| TMAH (25%, 80° C.) | 37 | 68 | 0.3-1 µm/min | <1 Å/min | <2 Å/min |
| EDP (115° C.) | 20 | 10 | 1.25 µm/min | <1 Å/min | <2 Å/min |

When anisotropic etching is performed on the Si(11k) surface of the silicon substrate 100, the Si(001) facet is etched at a higher speed than that of the Si(111) facet, as illustrated in FIGS. 3A to 3C, and thus the Si(111) facet that is exposed by a terrace portion of the Si(11k) surface increases. Unlike a silicon substrate having a low index satisfying 2≤k≤6, in the case of a silicon substrate having a high index satisfying 7≤k≤13, when the Si(111) facet is exposed by a smaller amount than that of the Si(001) facet, a single crystalline GaN thin film is not easily grown. On the other hand, in the current embodiment, the Si(111) facet is exposed by a larger amount than that of the Si(100) facet through anisotropic etching, with respect to the silicon substrate 100 having a high index crystal orientation, thereby allowing a single crystalline GaN thin film 130 to be easily formed on the silicon substrate 100. In addition, the related art regarding the growth of a semipolar GaN uses a silicon substrate that is patterned using an ordinary method, and thus an etching process using a mask is necessary. On the other hand, the manufacturing method according to the current embodiment does not require an etching process using a mask.

Figure 2B:
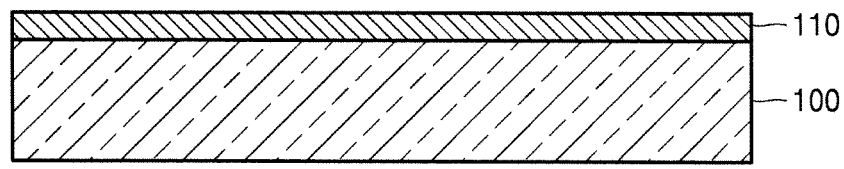

Referring to FIG. 2B, a nucleation-growth layer 110 is formed on the silicon substrate 100 (operation S30). A nucleation-growth layer 120 may be formed of AlN. The nucleation-growth layer 110 may have a thickness of several tens to several hundreds of nanometers. The nucleation-growth layer 120 may be formed using any one of metal organic chemical vapor deposition (MOCVD), sputtering, and hydride vapor phase epitaxy (HYPE). In the step of growing the nucleation-growth layer 110, an Al source is injected to a deposition apparatus prior to an N source. This is for the purpose of preventing, in a case of using ammonia which is an N source, the silicon substrate 100 from being exposed first by ammonia and being nitrified. The nucleation-growth layer 110 is a layer for forming a nucleus of crystallization growth, and prevents a melt-back phenomenon occurring by reaction between the silicon substrate 100 and a buffer layer 120 that is subsequently formed. The melt-back phenomenon means a phenomenon in which Ga contained in the buffer layer 120 contacts and reacts with the silicon substrate 100. When the melt-back phenomenon occurs, crystallizability of a semiconductor device collapses. In addition, the nucleation-growth layer 110 may take a role in satisfactorily wetting the buffer layer 120 to be grown thereon.

Figure 2C:
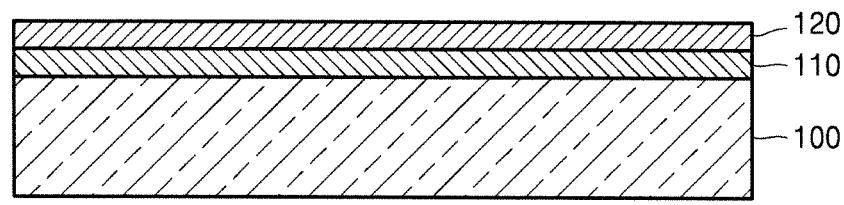

Referring to FIG. 2C, the buffer layer 120 is formed on the nucleation-growth layer 110 (operation S40). The buffer layer 120 includes one layer or a plurality of layers, and may be formed of a material including any one selected from a group consisting of AlN, AlGaN, a step grade $Al_xIn_y Ga_{1-x-y}N$ (0≤x, y≤1, x+y≤1), and an $Al_{x1}In_{y1}Ga_{1-x1-y1}N/Al_{x2}In_{y2}Ga_{1-x2-y2}N$ (0≤x1, x2, y1, y2≤1, x1≠x2 or y1≠y2, x1+y1≤1, x2+y2≤1) superlattice. The buffer layer 120 is a layer for growing the GaN thin film 130 having a high crystallizability and generating a crack by suppressing a difference in lattice and thermal expansion coefficient between the silicon substrate 100 and the GaN thin film 130. The buffer layer 120 may be formed using any one of MOCVD, sputtering, and HVPE.

Although FIG. 2C illustrates the buffer layer 120 that is configured as one layer, the number of buffer layers 120 may be plural. In addition, one buffer layer 120 or one of the plurality of buffer layers 120 may act as a nucleation-growth layer. The current embodiment describes an example in which the nucleation-growth layer 110 is AlN, but the nucleation-growth layer 110 may be formed of $Al_{x3}In_{y3}Ga_{1-x3-y3}N$ (0≤x3, y3≤1, x3+y3≤1). The nucleation-growth layer 110 and the buffer layer 120 may be distinguished from each other by the respective composition materials.

Figure 2D:
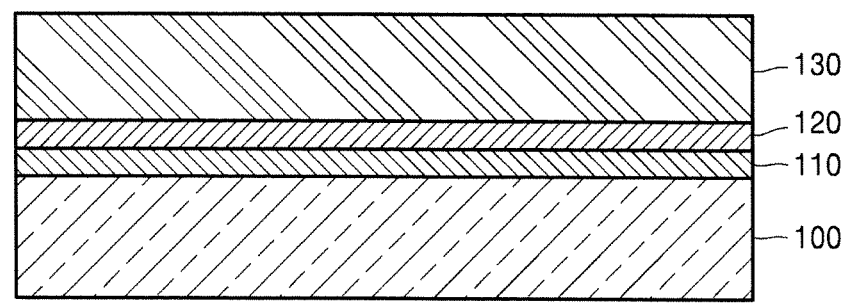

FIG. 2D illustrates a nitride semiconductor structure in which the GaN thin film 130 is formed. Referring to FIG. 2D, the GaN thin film 130 is formed on the buffer layer 120 (operation S50). The GaN thin film 130 may be laminated to have a thickness of, for example, approximately 1 μm to 500 μm. The GaN thin film 130 may be formed using any one of MOCVD, sputtering, and HVPE.

Figure 4:
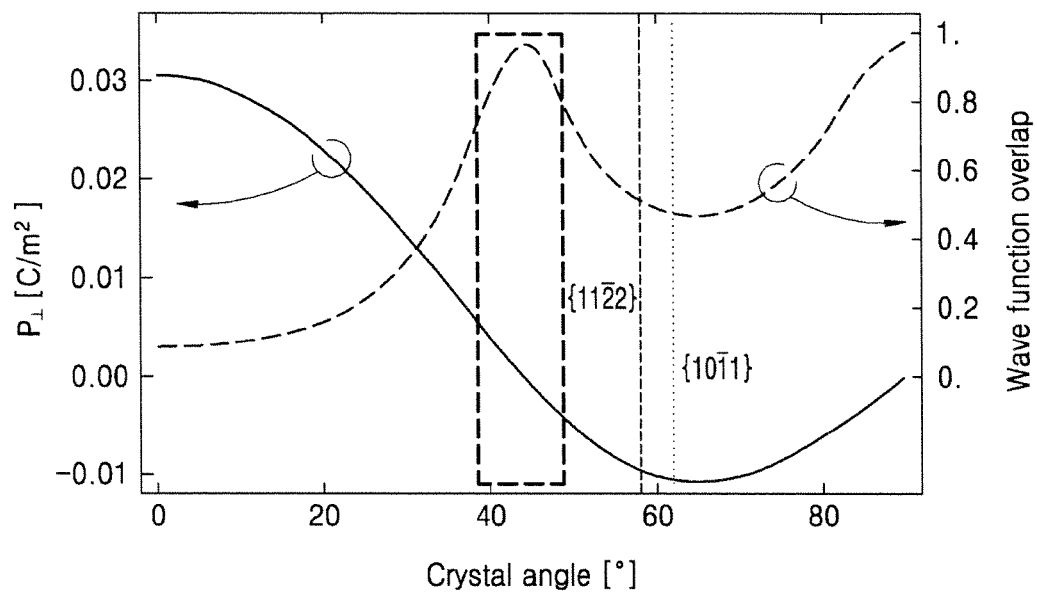
FIG. 4 is a graph illustrating a relation between a crystallization angle and a semipolar characteristic

FIG. 4 is a graph illustrating a relation between a crystallization angle and a semipolar characteristic, and shows changes in a polarization field according to a c-axis and the Si(111) facet (hereinafter, referred to as an angle of a c-axis). Referring to FIG. 4, when the angle of the c-axis is within a range satisfying 35°≤k≤50°, and preferably, when the angle is approximately 45°, a polarization field of GaN becomes approximately 0, and thus it is seen that GaN has a semipolar characteristic.

Meanwhile, Table 2 shows an angle between the Si(111) facet and GaN(0001) of the GaN thin film 130 according to changes in a k value in the Si(11k) surface of the silicon substrate 100. Referring to Table 2, it is seen that the angle of the GaN thin film 130 formed on the silicon substrate 100 having a high index satisfying 7≤k≤13 is within a range of approximately 43°≤k≤49°.

TABLE 2

|  | Si(117) | Si(119) | Si(11 11) | Si(11 13) |
| --- | --- | --- | --- | --- |
| Angle Between Si(111) and GaN(0001) | 43.4° | 45.8° | 47.4° | 48.55° |

As described above, since the amount of Si(111) facet generated in the Si(11k) surface of the silicon substrate 100 is greater that of Si(100) facet through anisotropic etching (and since the Si(111) facet has a lower formation energy than that of the Si(001) facet), a deposition of the GaN thin film 130 (and also depositions of the nucleation-growth layer 110 and the buffer layer 120) on the Si(111) facet is superior to that on the Si(100) facet, the GaN thin film 130 may be grown so that GaN (0001)//Si(111). That is, the c-axis of the GaN thin film 130 grown on the Si(11k) surface having a high index of 7≤k≤13 has an angle illustrated in Table 2. Accordingly, the nitride semiconductor structure manufactured according to the current embodiment may have a semipolar characteristic in which a polarization field is approximately 0, as illustrated in FIG. 4. On the other hand, in a case of GaN (comparative example) which is grown on a silicon substrate having (112) to (116) facets, it is seen that the c-axis has an angle of equal to or less than 30 degrees, and thus a polarization field becomes relatively larger.

As described above, the nitride semiconductor structure manufactured according to the current embodiment has a semipolar characteristic, and thus the nitride semiconductor structure manufactured may be used as a semipolar nitride semiconductor substrate, for example, a GaN wafer. In addition, a light emitting device using the nitride semiconductor structure may reduce droop, may be manufactured to have a large size, and may improve its competitive price with respect to a present fluorescent light by reducing cost.

Figure 5A:
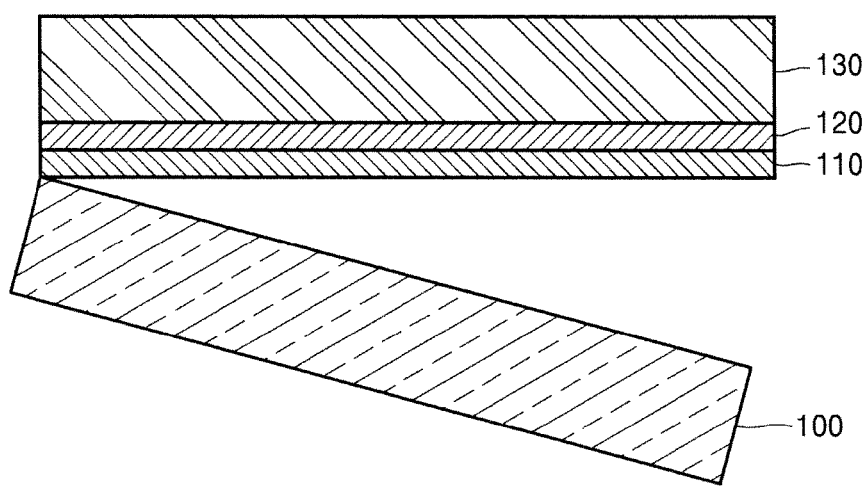
FIGS. 5A and 5B are diagrams illustrating a method of manufacturing a nitride semiconductor structure according to another embodiment of the inventive concept.
Figure 5B:
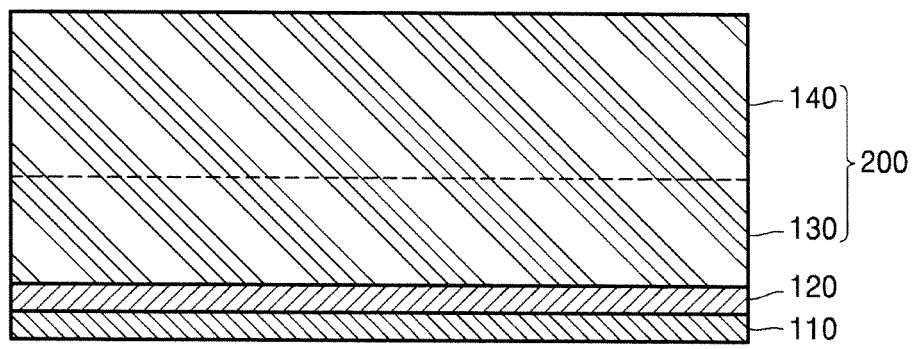

FIGS. 5A and 5B are diagrams illustrating a method of manufacturing a nitride semiconductor structure according to another embodiment of the inventive concept. In-situ etching may be performed on a silicon substrate 100 to obtain a GaN structure being relatively thin in a freestanding state from which the silicon substrate 100 is removed, as illustrated in FIG. 5A. Then, a nitride bulk layer 140 is further laminated on a GaN thin film 130 that is previously laminated, to obtain a nitride semiconductor structure 200 having a desired thickness. In this manner, the nitride semiconductor structure 200 that is obtained after further laminating the nitride bulk layer 140 may be used as a freestanding nitride semiconductor substrate. For example, a GaN layer obtained by further laminating GaN on the GaN thin film 130 that is previously laminated may be used as a freestanding GaN semiconductor substrate. At this time, the freestanding nitride semiconductor substrate may include a nucleation-growth layer 110 and a buffer layer 120 as illustrated in FIG. 5B, and may have a structure from which the nucleation-growth layer 110 and the buffer layer 120 are removed, when necessary. The nucleation-growth layer 110 and the buffer layer 120 may be removed after etching the silicon substrate 100 or may be removed after laminating the nitride bulk layer 140.

A process of etching the silicon substrate 100 may be performed after laminating the GaN thin film 130 to have a thickness of approximately 1 μm to 500 μm, for example, a thickness of several to several tens of μm. The silicon substrate 100 may be etched using an HCl gas within a reactor under a temperature of, for example, approximately 800° C. to 1100° C. At this time, a partial pressure of the HCl gas may be 1 to 100%. The etching of the silicon substrate 100 may be performed until an N-face of the GaN thin film 130 is exposed, thereby completely etching the silicon substrate 100.

The etching of the silicon substrate 100 may be performed in a state where the growth of the nitride semiconductor is stopped. The etching of the silicon substrate 100 may be performed at the same time when the growth of the nitride semiconductor is proceeding. That is, in a state where the GaN thin film 130 is first laminated to have an appropriate thickness, the laminating processing of the nitride semiconductor and the etching process of the silicon substrate 100 may be performed simultaneously. Simultaneous performance is possible because the etching of the silicon substrate 100 is performed in situ within the reactor.

Meanwhile, the nitride bulk layer 140 may further be grown on the GaN thin film 130, previously laminated, using an HVPE process to have a thickness of at least 10 µm, more specifically, a thickness of several hundreds of µm to several mm. For example, the silicon substrate 100 is completely etched, and GaN may be further grown to have a thickness of approximately 400 µm.

Figure 6:
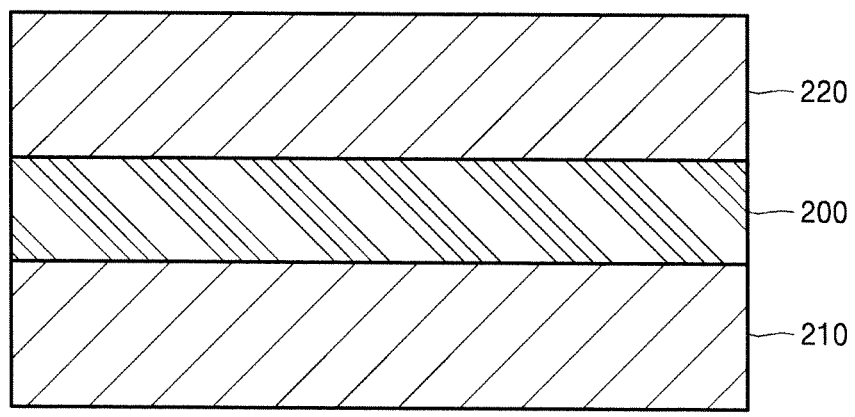
FIG. 6 is a diagram illustrating a semipolar nitride semiconductor bulk substrate that is manufactured according to another embodiment of the inventive concept.

FIG. 6 is a diagram illustrating a semipolar nitride semiconductor bulk substrate manufactured according to another embodiment of the present invention. Referring to FIG. 6, the semipolar nitride semiconductor bulk substrate according to the current embodiment may be manufactured by further forming nitride bulk layers 210 and 220 by using the nitride semiconductor structure 200, manufactured as described above with reference to FIGS. 5A and 5B, as a seed layer. The nitride bulk layers 210 and 220 may be formed using an ammonothermal technique of regrowing the nitride semiconductor structure 200 as a seed layer within, for example, a container in a supercritical state.

While the inventive concept has been particularly shown and described with reference to exemplary embodiments thereof, it will be understood that various changes in form and details may be made therein without departing from the spirit and scope of the following claims.

What is claimed is:

1. A method of manufacturing a semipolar nitride structure, the method comprising:
   preparing a silicon substrate having a Si(11k) surface satisfying 7≤k≤13;
   performing anisotropic etching on the Si(11k) surface of the prepared silicon substrate so that, at least at a first region of the Si(11k) surface of the silicon substrate, a Si(111) facet is exposed by a larger amount than a Si(100) facet; and
   growing a nitride semiconductor layer on the first region of the silicon substrate,
   wherein the nitride semiconductor layer has a semipolar characteristic in which a polarization field is approximately 0.

2. The method of claim 1, wherein the anisotropic etching is performed using any one etching solution selected from a group consisting of KOH, TMAH, EDP, N2H2, HaOH, and CsOH.

3. The method of claim 1, wherein the anisotropic etching is maskless etching.

4. The method of claim 1, wherein the nitride semiconductor layer is a single crystalline GaN thin film.

5. The method of claim 4, wherein a c-axis of the GaN thin film is within a range satisfying 35°≤θ≤45°.

6. The method of claim 1, wherein the growing of the nitride semiconductor layer comprises forming a buffer layer on the silicon substrate.

7. The method of claim 6, wherein the buffer layer is formed of a material comprising any one selected from a group consisting of AlN, AlGaN, a step grade $Al_xIn_yGa_{1-x-y}N$ (0≤x, y≤1, x+y≤1), and an $Al_{x1}In_{y1}Ga_{1-x1-y1}N/Al_{x2}In_{y2}Ga_{1-x2-y2}N$ (0≤x1, x2, y1, y2≤1, x1≠x2 or y1≠y2, x1+y1≤1, x2+y2≤1) superlattice.

8. The method of claim 6, wherein the growing of the nitride semiconductor layer comprises forming a nucleation-growth layer on the silicon substrate, wherein the nucleation-growth layer is formed of AlN.

9. The method of claim 1, further comprising forming a nitride bulk layer using the nitride semiconductor layer as a seed layer.

10. The method of claim 9, further comprising removing the silicon substrate.

11. A method of manufacturing a semipolar nitride structure, the method comprising:
   performing anisotropic etching on a Si(11k) surface of a silicon substrate, where 7≤k≤13, so that, at least at a first region of the Si(11k) surface of the silicon substrate, a Si(111) facet is exposed by a larger amount than a Si(100) facet;
   forming a nitride semiconductor layer on the buffer layer, wherein the nitride semiconductor layer has a semipolar characteristic in which a polarization field is approximately 0; and
   removing the silicon substrate from the nitride semiconductor layer.

12. The method of claim 11, wherein the nitride semiconductor layer is GaN.

* * * * *